US008141754B2

(12) United States Patent
Conner et al.

(10) Patent No.: US 8,141,754 B2

(45) Date of Patent: Mar. 27, 2012

(54) PRESSURIZED FLUID DISPENSER

(75) Inventors: Michael Conner, Uniontown, OH (US); Robert Vystrcil, Garrettsville, OH (US); Jeffery Morgan, Cuyahoga Falls, OH (US); Shawn Whetsone, New Albany, OH (US); Terry Birchler, New Albany, OH (US); David Chaney, Sagamore Hills, OH (US)

(73) Assignee: Techtronic Floor Care Technology Limited, Tortola (VG)

( * ) Notice: Subject to any disclaimer, the term of this patent is extended or adjusted under 35 U.S.C. 154(b) by 521 days.

(21) Appl. No.: 12/256,993

(22) Filed: Oct. 23, 2008

(65) Prior Publication Data

US 2009/0173753 A1 Jul. 9, 2009

Related U.S. Application Data

(60) Provisional application No. 61/000,189, filed on Oct. 24, 2007.

(51) Int. Cl.

*B65D 88/54* (2006.01)
*B67D 7/58* (2010.01)
*H05K 7/10* (2006.01)
*H01R 13/44* (2006.01)
*A62C 15/00* (2006.01)

(52) U.S. Cl. ..................... 222/333; 222/325; 222/383.1; 361/644; 361/808; 439/135; 439/500; 239/332; 239/154

(58) Field of Classification Search ........... 222/333.538, 222/608, 189.11, 175, 385, 63, 626, 382, 222/325, 383.1, 162; 239/152–154, 332; 320/107, 111; 361/644, 645, 647, 808, 807, 361/809; 439/135, 500

See application file for complete search history.

(56) References Cited

U.S. PATENT DOCUMENTS 3,608,824 A 9/1971 Ballou
4,610,605 A 9/1986 Hartley
4,801,051 A 1/1989 Baker et al.
4,801,088 A 1/1989 Baker
4,865,255 A 9/1989 Luvisotto
5,320,281 A 6/1994 Hartmann et al.
5,664,940 A 9/1997 Du
5,752,661 A * 5/1998 Lewis .......................... 239/153

(Continued)

FOREIGN PATENT DOCUMENTS

WO 99/27253 6/1999

(Continued)

OTHER PUBLICATIONS

PCT/US2008/080984 International Search Report and Written Opinion, 9 pages, Dec. 15, 2008.

*Primary Examiner* — Kevin P Shaver
*Assistant Examiner* — Stephanie E Williams
(74) *Attorney, Agent, or Firm* — Michael Best & Friedrich LLP

(57) ABSTRACT

A pressurized fluid dispenser includes a base unit and a reservoir. The base unit includes a pump and a battery compartment including electrical contacts electrically connected with the pump. The reservoir is supported by and selectively removable from the base unit. The reservoir includes an internal compartment that is in fluid communication with the pump when the reservoir is connected to the base unit. A female panel mount for an electrically operated unit is also disclosed.

25 Claims, 10 Drawing Sheets

U.S. PATENT DOCUMENTS

| | | | | |
|---|---|---|---|---|
| 5,785,245 | A * | 7/1998 | Tedders et al. | 239/9 |
| 5,791,882 | A | 8/1998 | Stucker et al. | |
| 5,975,423 | A | 11/1999 | Rice et al. | |
| 5,996,907 | A * | 12/1999 | Toetschinger et al. | 239/305 |
| 6,048,183 | A | 4/2000 | Meza | |
| 6,057,610 | A | 5/2000 | Nierescher | |
| 6,059,143 | A | 5/2000 | Weir | |
| 6,070,808 | A | 6/2000 | Kildow | |
| 6,094,773 | A | 8/2000 | Krentz et al. | |
| 6,154,917 | A | 12/2000 | Zahuranec et al. | |
| 6,158,669 | A | 12/2000 | Louis | |
| 6,162,027 | A | 12/2000 | Tuell | |
| 6,189,811 | B1 | 2/2001 | Rudy | |
| 6,513,188 | B2 | 2/2003 | Zahuranec et al. | |
| 6,554,587 | B2 | 4/2003 | Paolini et al. | |
| 6,607,360 | B2 | 8/2003 | Fong | |
| 6,623,245 | B2 | 9/2003 | Meza et al. | |
| 6,644,564 | B2 | 11/2003 | Perkitny | |
| 6,840,745 | B1 | 1/2005 | Macauley et al. | |
| 6,892,957 | B2 | 5/2005 | Bennett et al. | |
| 7,007,826 | B2 | 3/2006 | Shapanus et al. | |
| 7,175,104 | B2 | 2/2007 | Allen, IV | |
| 7,198,204 | B2 | 4/2007 | Bennett et al. | |
| 7,207,500 | B2 * | 4/2007 | Hudson et al. | 239/332 |
| 7,472,842 | B2 * | 1/2009 | Gilpatrick et al. | 239/397 |
| 7,506,386 | B1 * | 3/2009 | Adrian | 4/598 |
| 7,526,833 | B2 | 5/2009 | Cochran et al. | |
| 7,556,210 | B2 * | 7/2009 | Mandell et al. | 239/158 |
| 7,753,290 | B2 * | 7/2010 | Jacques et al. | 239/329 |
| 2003/0232530 | A1 | 12/2003 | Vista, Jr. et al. | |
| 2004/0084552 | A1 | 5/2004 | Huartson | |
| 2004/0088817 | A1 | 5/2004 | Cochran et al. | |
| 2004/0118940 | A1 | 6/2004 | Lavitt | |
| 2005/0183231 | A1 | 8/2005 | Mein | |
| 2006/0280628 | A1 | 12/2006 | Hou | |
| 2007/0090796 | A1 | 4/2007 | Norris | |
| 2007/0113369 | A1 | 5/2007 | Cochran et al. | |
| 2007/0120366 | A1 | 5/2007 | Grant et al. | |

FOREIGN PATENT DOCUMENTS

| | | |
|---|---|---|
| WO | WO 01/93919 A1 | 12/2001 |

* cited by examiner

PRESSURIZED FLUID DISPENSER

This application claims priority to provisional patent application Ser. No. 61/000,189, filed Oct. 24, 2007, which is incorporated by reference herein in its entirety.

BACKGROUND

This disclosure generally relates to a pressurized fluid dispenser, which can also be referred to as a power washer or pressure washer. However, the present disclosure also describes a female panel mount for an electrically operated unit, which need not be used in association with a pressurized fluid dispenser.

Small and portable power washers are an increasingly popular outdoor power tool; however, some drawbacks to exist with regard to the mobility of known power washers. Known portable power washers are typically not suitable for use remote from electrical outlets that are connected with an electrical utility grid. Typically, power washers include an electric pump that is operated by electrical power that is received from a wall outlet through an electrical cord that is plugged into the wall outlet. This can require the power washer to be used near buildings and other structures that include these wall outlets, or it requires a very long extension cord to be used with the power washer. This limits where these power washers can be used.

Moreover, known power washers are not configured for easy refilling. To refill the reservoir of these known washer units, the operator typically must move the entire unit, including the electrical components for the power washer (e.g. the electric pump), and carry these components to a fluid source for filling the reservoir. This requires the operator to carry unnecessary components, e.g. the electric pump and other electrical components, to a fluid source, e.g. a spigot, to fill the reservoir. This can limit the available water sources for filling the reservoir, especially where electrical components are attached to the reservoir. For example, the operator of the power washer may not want to dunk a power washer that includes an attached electric pump into a pond or stream to fill the reservoir. Moreover, this results in added weight that must be carried around by the operator when filling the reservoir.

SUMMARY

A pressurized fluid dispenser that can overcome the aforementioned shortcomings includes a base unit and a reservoir. The base unit includes a pump and a battery compartment including electrical contacts electrically connected with the pump. The reservoir is supported by and selectively removable from the base unit. The reservoir includes an internal compartment that is in fluid communication with the pump when the reservoir is connected to the base unit.

An example of a female panel mount for an electrically operated unit that can provide the unit with greater mobility includes an electrical cord receptacle configured to receive and electrically connect with an associated electrical cord. Also provided is a battery receptacle configured to receive and electrically connect with an associated battery. The battery receptacle is spaced from the electrical cord receptacle such that when a portion of the associated battery is inserted into the battery receptacle the electrical cord receptacle is covered by another portion of the associated battery.

Another example of a pressurized fluid dispenser that can overcome the aforementioned shortcomings includes a housing, a pump supported by the housing, a reservoir connected with the housing, a first electrical receptacle supported by the housing and electrically connected with the pump, and a second electrical receptacle supported by the housing and electrically connected with the pump. The reservoir includes an internal compartment that is in fluid communication with the pump. The first electrical receptacle is configured to cooperate with an associated battery. The second electrical receptacle is spaced from the first electrical receptacle and is configured to cooperate with an associated electrical cord.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings. In addition other than where otherwise indicated, all numbers expressing quantities of electrical properties and physical parameters and so forth used in the specification and claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention.

Figure 1:
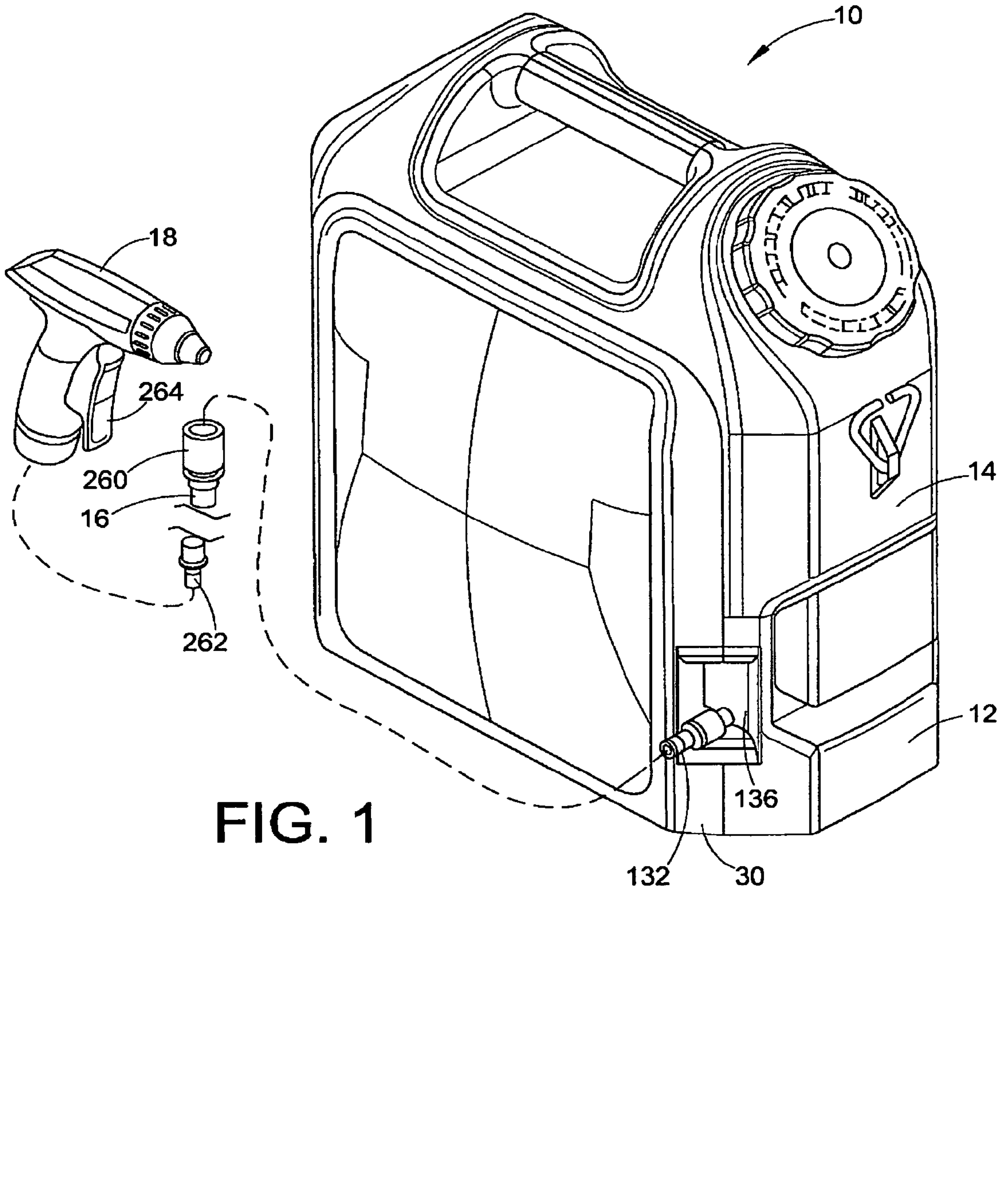
FIG. 1 is a perspective view of a pressurized fluid dispenser according to one embodiment of the present disclosure.

With reference to FIG. 1, a pressurized fluid dispenser 10 is shown in the form of a liquid dispenser, which for conciseness will be termed a "power washer." The pressurized fluid dispenser can also be referred to as a pressure washer. Generally, the pressurized fluid dispenser 10 includes a base unit 12, a reservoir 14, a hose 16, and a nozzle 18. The reservoir 14 is detachable from the base unit 12 so that the reservoir can be easily refilled without requiring the person who refills the reservoir to carry the base unit and all of the components that are found in the base unit to a liquid source. In one embodiment, the liquid can be water.

The base unit 12 houses the working components of the power washer 10. The power washer 10 in one embodiment generally includes a low voltage (e.g. 48 volts or less such as in one particular embodiment 15 V) and low pressure (e.g. 100 psi or less) water sprayer. Such pressurized sprayers have been referred to as Type 1 sprayers. Water, or another fluid, that is stored in the reservoir 14 flows into the base unit 12, is pressurized, and then flows through the hose 16 towards the nozzle 18, which selectively controls the release of water from the power washer 10. The power washer 10 is useful in providing a pressurized water source at locations that are remote from a municipal water source, and are remote from an outlet that is connected with a large electrical grid, such as a municipal electrical grid. Additional accessories, e.g. a shower head (not shown) can be provided to increase the versatility of the dispenser 10.

Figure 2:
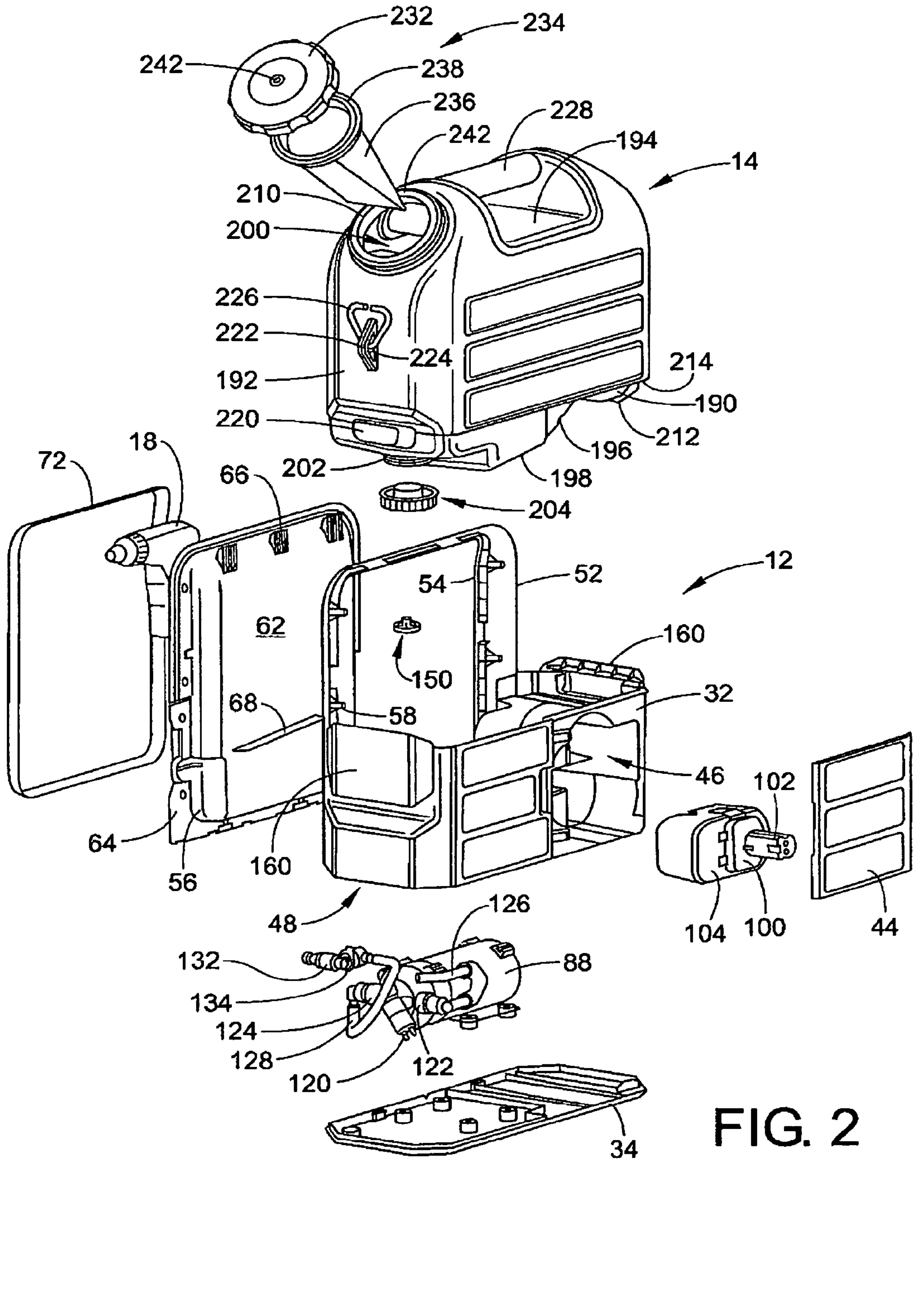
FIG. 2 is an exploded view of the pressurized fluid dispenser shown in FIG. 1.

The base unit includes a housing 30 that contains the working components of the power washer 10. With reference to FIG. 2, the housing includes a generally box-shaped shell 32 that has a base panel 34 attached to a lower edge of the shell 32. As more clearly seen in FIG. 3, the box-shaped shell 32 includes a reservoir support ledge 36 having an inclined section 38, which in cooperation with the shape and design of the reservoir 14 results in fluid being directed toward a socket 42 en route to being pressurized, which will be described in more detail below. A door 44 connects with the box-shaped shell 32 to cover a battery compartment 46 in the base unit 12. The door 44 opens, e.g. pivots, to provide access to the battery compartment 46. The box-shaped shell 32 also defines a pump compartment 48, which is next to the battery compartment 46 and is covered by the base panel 34.

The housing 30 of the base unit 12 also includes a side extension 52 that extends upwardly from one side of a periphery of the box-shaped shell 32. As more clearly seen in FIG. 2, the side extension 52 is generally U-shaped having its terminal ends connected to the box-shaped shell 32 to define an opening 54. The side extension 52 spans one of the longer sides of the box-shaped shell 32. The housing 30 of the base unit 12 also includes a compartment wall 56 connected with the side extension 52. Fasteners 58 are provided to connect the side extension 52 with the compartment wall 56; however, the compartment wall can attach to the side extension in other conventional manners. The compartment wall 56 includes a central indented section 62 that extends through the opening 54 of the side extension 52 into the housing covering the opening 54 when the compartment wall attaches to the side extension. The compartment wall 56 also includes a peripheral section 64 that surrounds the central indented section 62. The peripheral section 64 contacts the side extension 52.

Indexing members 66 (three are shown in the depicted embodiment, but more or less could be provided) extend upwardly from an upper region of the indented section 62 and are configured to cooperate with the reservoir 14 in a manner that will be described in more detail below. In the depicted embodiment, the indexing members 66 are in the shape of tabs that extend upwardly, but the indexing members can take other configurations. In the depicted embodiment, the compartment wall 56 (as well as the remainder of the housing 30) are made from plastic and the indexing members 66 are integrally formed with the compartment wall. The compartment wall 56 also includes an integrally formed slanted shelf 68 that aligns with the reservoir support ledge 36 (FIG. 3) when the compartment wall 56 is attached to the side extension 52.

A side panel 72 connects with the side extension 52. The side panel 72, the side extension 52 and the compartment wall 56 define a compartment for storing at least one of a hose (for example hose 16 in FIG. 1), a nozzle 18 and a battery charger (not shown). The panel 72 shown in the embodiment depicted in FIG. 2 can be made from a flexible material and can include a zipper to provide access to the storage compartment.

Figure 4:
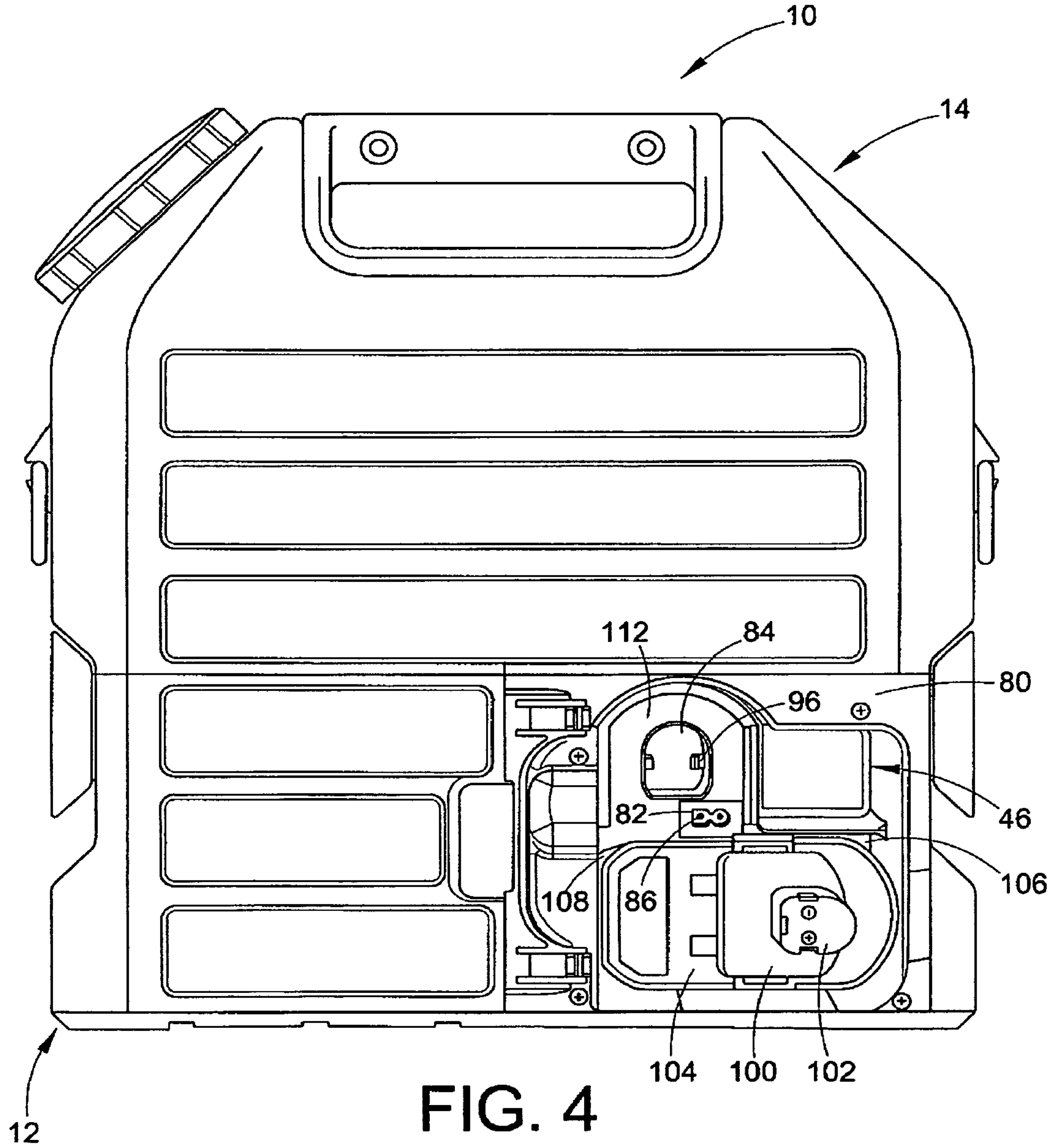
FIG. 4 is a side perspective view of the pressurized fluid dispenser shown in FIG. 1 with a door of the base unit removed.
Figure 5:
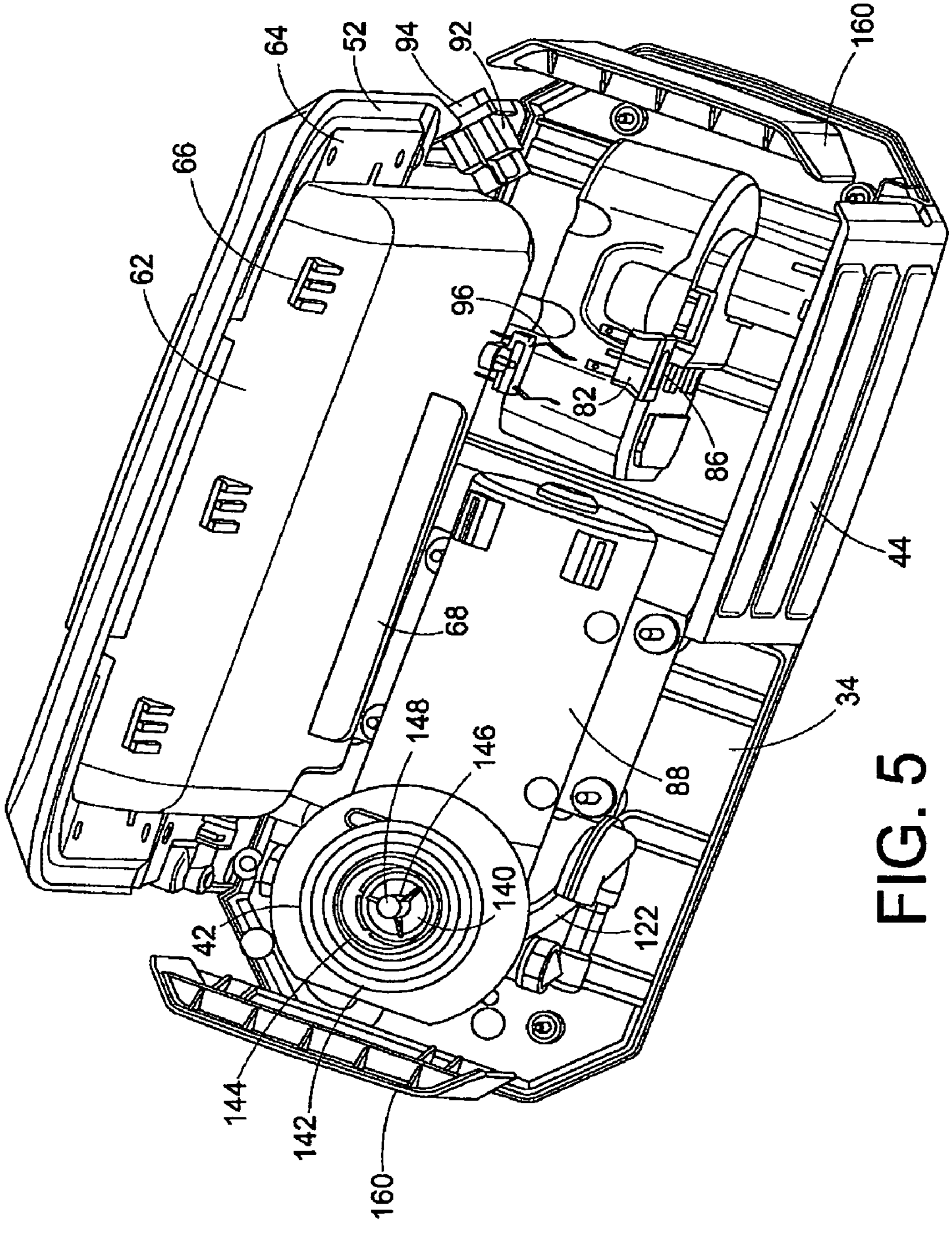
FIG. 5 is an upper perspective view similar to FIG. 3 with a portion of the base unit housing removed to show the internal components of the base unit.

With reference to FIG. 4, the base unit 12 includes the battery compartment 46. In the illustrated embodiment, a female panel mount 80 is located within the battery compartment 46. The female panel mount 80 is shown in the power washer 10; however, the female panel mount 80 can be found in other electrically operated units, for example power drivers, power saws, trimmers, chain saws, sanders, and other electrically operated power tools. The female panel mount 80 includes an electrical cord receptacle 82 and a battery receptacle 84. Electrical contacts 86 are disposed in the electrical cord receptacle 82 and are electrically connected with a pump 88 (FIGS. 2 and 5), which will be described in more detail below, and a switch 92 (FIG. 5), which is operated by a button 94 (FIG. 5). Electrical contacts 96 are disposed in the battery receptacle 84 and also electrically connect with the pump 88 and the switch 92. The circuitry connecting the contacts 86 and 96 to the switch 92 and the pump 88 are not shown, however, conventional circuitry can be used. Moreover, the electrical cord receptacle 82 is configured to receive an end of an electrical cord (not shown) having at its other end a male connector that is configured to be inserted into a cigarette lighter (or vehicle power outlet) or other power source, e.g. a conventional wall outlet. Accordingly, the electrical cord receptacle is configured to receive 12 V DC in the case of a vehicle power outlet. The electrical contacts 96 in the battery receptacle 84 can be configured to receive power from an 18 V rechargeable battery 100 that includes a battery stem 102 and a battery pack portion 104. If desired, the battery receptacle 84 and the electrical contacts 96 can be reconfigured to receive a battery of another shape, e.g. one or more alkaline D batteries or rechargeable nickel cadmium batteries. Although the electrical contacts also can be configured for other types of batteries that can be used including one or more rechargeable metal halide or lithium ion batteries or batteries producing other useful voltages such as nominal voltages of 19.2, 24, or 28.8. Since the electrical cord receptacle 82 is configured to receive a different voltage than the battery receptacle 84, power conditioning elements can be provided in the circuitry (not shown) to allow these two different power sources to operate the electrical pump 88.

More particular to the embodiment depicted in FIG. 4, the battery receptacle 84 in the depicted embodiment is configured to receive the stem 102 of a rechargeable battery 100. The rechargeable battery shown in FIG. 4 is of a conventional size and shape for a conventional 18 V or 12 V rechargeable battery.

The battery compartment 46 includes a first battery receptacle, which is the battery receptacle 84, that is supported by the housing and electrically connected with the pump 88 (FIG. 2) and a second battery receptacle 106, which is a storage battery receptacle. In the illustrated embodiment, the storage battery receptacle 106 is spaced from the electrical cord receptacle 82 and the first battery receptacle 84. The storage battery receptacle 106 is configured to receive and to store a conventional 12 V or 18 V rechargeable battery 100 while the stem (similar to the stem 102) of another battery, e.g. another 12 V or 18 V rechargeable battery, is received in the first battery receptacle 84 and is providing power to the electrical pump 88. In order to accomplish this in the depicted embodiment, the storage battery receptacle 106 is large enough to accommodate a conventional 12 V or 18 V rechargeable battery while another conventional 12 V or 18 V rechargeable battery of the same size can be received inside the first battery receptacle 84. The storage battery receptacle 106 is defined at its rear by a rear wall 108 that is spaced from an upper rear wall 112 in which the first battery receptacle 84 is recessed. The spacing between the lower rear wall 108 and the upper rear wall 112 is enough to accommodate the battery pack portion 104 of the conventional rechargeable battery 100 so that the forward most surface of the battery pack portion 104 is at least substantially flush with or recessed behind the upper rear surface 112. If the first battery receptacle 84 were reconfigured to accommodate a battery of a different size, the shape and configuration of the storage battery receptacle 106 can change to accommodate the same type of battery.

The electrical cord receptacle 82 is spaced from the first battery receptacle 84 such that when a battery is received in the first battery receptacle 84 the battery covers the electrical cord receptacle 82. More particular to the embodiment disclosed in FIG. 4, when the stem 102 of the rechargeable battery 104 is received in the first battery receptacle 84, the battery pack portion 104 of the rechargeable battery covers the electrical cord receptacle 82. It has been found that if a power operated unit, such as the power washer or the other tools described above, is receiving power from an electrical cord in electrical communication with a car battery while the rechargeable battery is attached, the voltage differential between the car battery and the rechargeable battery will result in a high current condition resulting in the draining and sourcing from one battery to the other. The female panel mount 80 shown in FIG. 4 avoids this problem because when the stem 102 of the rechargeable battery 100 is inserted into the first receptacle 84, the battery pack portion 104 of the rechargeable battery covers the electrical cord receptacle 82. If desired, the electrical cord receptacle 82 can be moved and can be in electrical communication with the first battery receptacle, via appropriate electrical circuitry, so that when the stem 102 of the rechargeable battery or contact of a rechargeable battery pack of a plurality of battery cells is inserted into the first battery receptacle 84 the battery 100 can recharge. Additionally, if desired an additional electrical cord receptacle can be provided that is spaced from the electrical cord receptacle 82. This additional electrical cord receptacle can be configured to receive 120 VAC (for example) and/or other provided line currents available in other countries such as 220 volts and be in electrical communication with the first battery receptacle 84 to recharge the battery 100.

Figure 3:
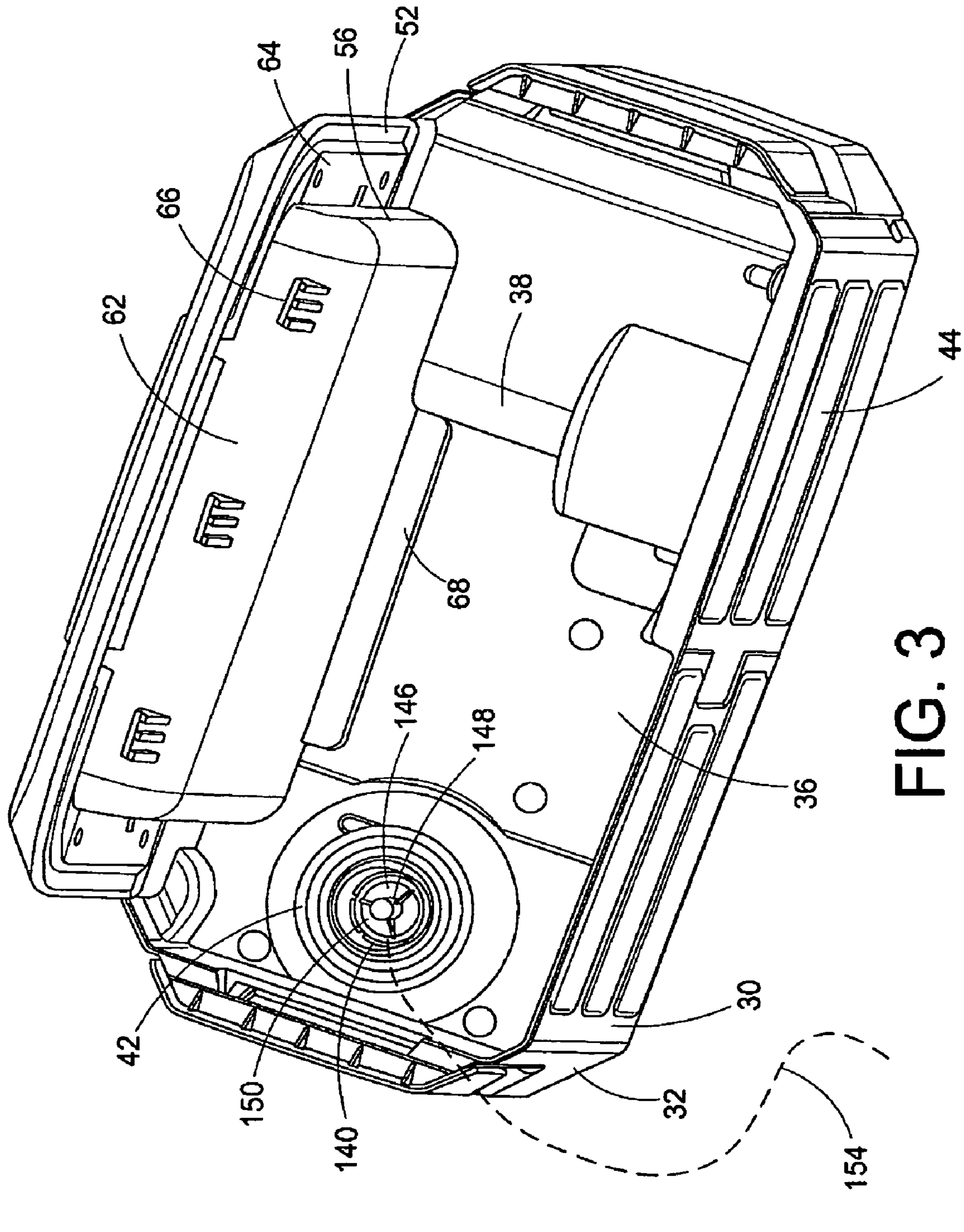
FIG. 3 is a upper perspective view of a base unit of the pressurized fluid dispenser shown in FIG. 1.

With reference back to FIG. 2, the base unit 12 also includes the pump 88, which includes electrical contacts 120 that are in electrical communication with the contacts 86 and 96 for the electrical cord receptacle and the battery receptacle, respectively, and the switch 92. The pump 88 depicted in FIG. 2 is a diaphragm pump, however other pumps can be used including rotary pumps, piston pumps and the like. The pump 88 includes a pump inlet 122 and a pump outlet 124. Inlet tubing 126 connects with the pump inlet 122 and also with the socket 42 (FIG. 3). Outlet tubing 128 connects with the pump outlet 124 and a fitting 132 that is mounted on an external surface of the base housing 30.

With reference to FIG. 1, the fitting 132 is movably mounted on the base unit 12. The fitting 132 is configured to connect with the hose 16. With reference to FIG. 2, the fitting 132 also includes a pivot joint 134 for movably mounting the fitting to the base unit 12 such that the fitting pivots between a substantially vertical orientation and a substantially horizontal orientation, which is shown in FIG. 1. With reference back to FIG. 1, the base unit housing 30 includes a cavity 136 formed in the housing. When the fitting 132 is oriented in the substantially vertical position, the fitting is disposed inside of the cavity 136 such that an outermost edge of the fitting is at least flush with the external surface of the housing or disposed inside of the cavity of the housing. By folding into the cavity 136, the fitting 132 is protected from being broken as well as from inadvertent contact with the side of the housing 30 as the fluid dispenser is being transported.

The fitting 132 shown in the depicted embodiment is a male quick-connect fitting. The male quick-connect fitting allows for a more compact base unit 12. Since the male quick-connect fitting 132 extends from the base unit housing 30, it is desirable to provide the cavity 136 and the movability for the fitting to protect the fitting from being broken.

With reference to FIG. 3, the base unit 12 also includes the socket 42 which generally defines an opening 140, which allows fluid to travel from the reservoir 14 into the inlet tubing 126 and thus into the inlet 122 of the pump 88 (FIG. 2). The socket 42 generally includes a rigid cylindrical boss 142, which is integrally formed with reservoir support ledge 36, and a concentric annular gasket 144 that is inward from the cylindrical boss and that surrounds the opening 140. A filter assembly 150, which includes a filter 146 and a frame 148 is disposed in the opening 140. With reference to FIG. 2, the filter assembly 150 can be removed from the opening 140. The frame 148 also operates as a valve actuator. When the filter assembly 150 is removed from the base unit 12 fluid is unable to pass from the reservoir 14 into the base unit, which will be described in more detail below. The filter 146 is upstream from the pump 88 and protects the pump from receiving residue and other materials that may be suspended in a liquid that is stored in the reservoir. The socket 42 can also be configured to connect with a hose 154 (depicted schematically in FIG. 3) to provide water, or other fluid, to the pump 88. This hose 154 can connect at one end to the socket 42 and the other end can be placed into a water source, e.g. a bucket or a pond, for providing water to the pump.

The base unit 12 also includes latches 160 on opposite narrower ends of the base unit housing 30. The latches 160 are centered on the narrower ends of the housing 30 between the longer sides of the base unit housing and cooperate with the reservoir 14 for connecting the reservoir to the base unit. In the depicted embodiment, the latches 160 are over center latches. Other types of latches and releasable connection mechanisms can be used; however, it can be desirable that the reservoir 14 release from the base unit 12 without the use of hand tools.

With reference back to FIG. 1, the reservoir 14 can be made from a plastic material. The reservoir can be a hollow unit having an internal chamber for storing a fluid, such as water. Multiple chambers can be provided in the reservoir, e.g. one chamber for storing water and another chamber for storing soap, spotless cleaning solutions, liquid wax, etc. The chambers can be in fluid communication with one another via a mixing valve assembly and/or mixing chamber. Thus, both single liquids and mixtures can be dispensed using the power washer 10. The reservoir 14 in the depicted embodiment is formed in the shape that can be described as having a base 190, a side or peripheral wall 192 that extends upwardly from the base, a top 194 and a lowermost support surface 196. The lowermost surface 196 of the reservoir 14 is shaped to complement the reservoir support ledge 36 and the inclined section 38 in the base unit housing 30. The lowermost supports surface 196 of the reservoir 14 includes an inclined section 198 that is configured to cooperate with the base unit to allow the reservoir to be situated so that fluid found in the internal compartment 200 of the reservoir is directed toward a lower outlet spout 202.

In the depicted embodiment, the lower outlet spout 202 is disposed vertically above the lowermost support surface 196 when the lowermost support surface is resting on an associated horizontal surface. A cap assembly 204, which includes a cap 206 and an umbrella valve 208, is threaded onto the lower outlet spout 202 and can be spaced above the ground level when the reservoir 14 is being refilled through an upper filling opening 210. Such a configuration should result in little or no damage to the umbrella valve 208 that is connected with the cap 206. The lowermost support surface 196 also includes a ridge 212 that is disposed at an end of the reservoir opposite the filling opening 206. The ridge 212 can provide a hand gripping section or location for an operator of the pressure washer 10 to grip the base 190 of the reservoir, which can be useful when scooping water out of lake, pond or creek.

The base 190 is indented with respect to a portion of the reservoir above the base to define a shoulder 214. The shoulder 214 at least substantially surrounds the base 190 and rests on the periphery of the shell 32 of the base unit housing 30 as the lowermost support surface 196 rests on the reservoir support ledge 36 and the inclined section 38 of the base unit housing. Accordingly, as seen in FIG. 1 the housing 30 of the base unit 12 substantially surrounds the lowermost supports surface 196 of the reservoir 14 when the reservoir 14 is received in the base unit 12.

The reservoir 14 also includes integrally formed catches 220 that cooperate with the over center latches 160 for attaching the reservoir 14 to the base unit 12. In an alternative embodiment, the latches 160 and the catches 220 can be reversed, e.g. latches can be located on the reservoir and catches can be located on the base unit.

The reservoir 14 also includes integrally formed bracket members 222 having openings 224 that receive triangular shaped hooks 226. The bracket members 222 are centered on opposite narrower sides of the peripheral side wall 192. The hooks 226 are provided to connect with a strap (not shown) that can be used to carry the power washer 10 and the reservoir 14 when the reservoir is detached from the base unit 12. The bracket members 222 and the hooks 226 allow the strap to run parallel to a greatest dimension of the reservoir 14 and the power washer. A handle 228 is also provided near the top 194 of the reservoir 14. The handle 228 is generally cylindrical having a central axis that is centered between the narrower sides of the peripheral side wall 192 and is aligned along an axis that intersects the integral bracket members 222. The orientation of the handle 228 and the bracket members 226 (and thus the strap) facilitates carrying the power washer 10 and the reservoir 14.

With reference again to FIG. 2, upper cap 232 and a filter assembly 234 connect with the reservoir 14 adjacent the upper filling opening 210. The cap 232 connects with the reservoir 14 to cover the filling opening 210. The filter assembly 234 includes a filter 236 and an annular shoulder 238 connected with the filter and/or supported by a threaded boss 242 that surrounds the filling opening 210. The annular shoulder 238 is made from a conformable material which allows the annular shoulder to operate as a gasket to seal the filling opening 210 when the cap 232 is attached to the reservoir 14. The filter 236 filters material prior to entering into the internal compartment 200 of the reservoir. This can be especially useful when the reservoir is dipped into a pond or a stream for filling. An air vent 242 can also be provided in the cap 232.

Figure 6:
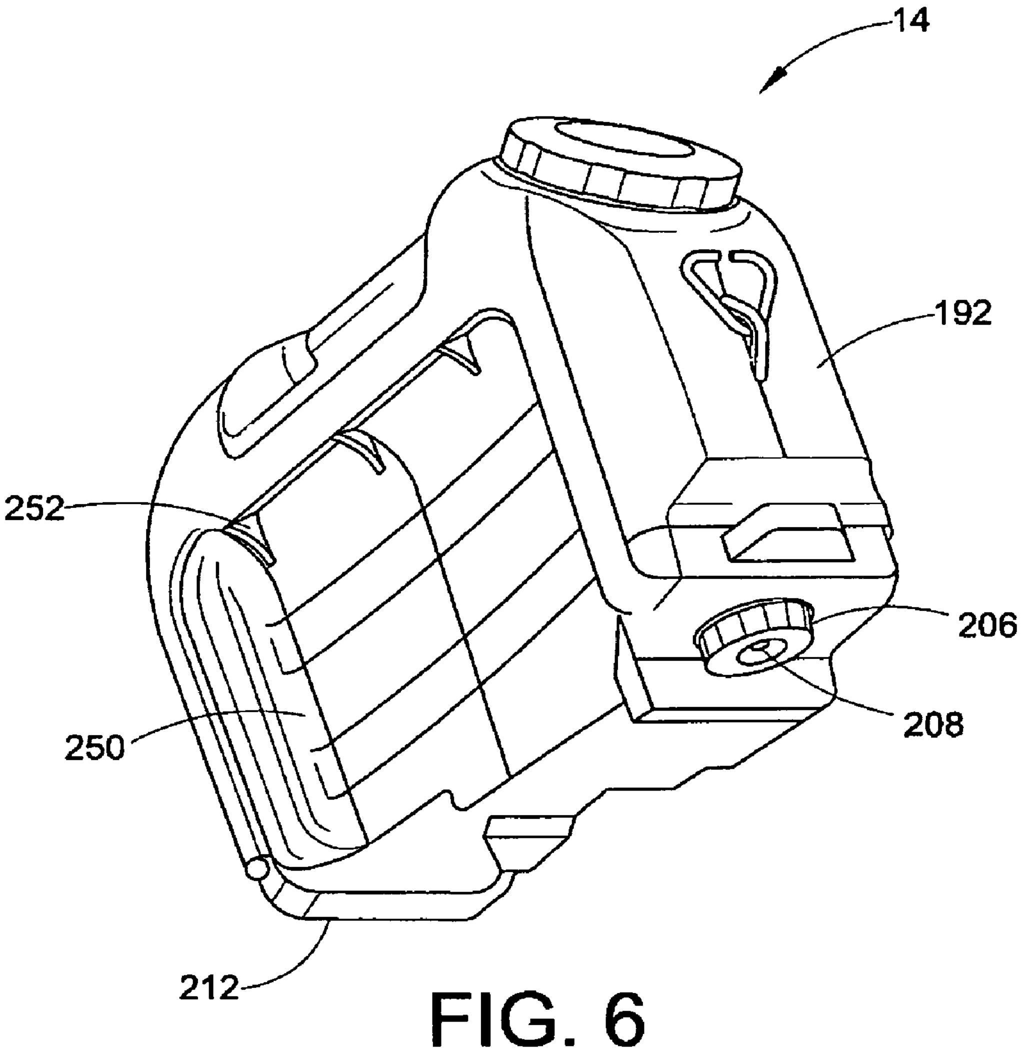
FIG. 6 is a perspective view of a lower surface of a reservoir of the pressurized fluid dispenser shown in FIG. 1.

With reference to FIG. 6, one of the larger sides of the peripheral side wall 192 of the reservoir 14 includes a recess 250 that provides a locating feature for the reservoir for when the reservoir 14 is being attached to the base unit 12. The recess 250 in the depicted embodiment is configured to receive the central indented section 62 (FIG. 2) of the compartment wall 56 (see FIG. 2) when the reservoir 14 is attached to the base unit 12. The reservoir 14 also includes smaller receptacles 252 formed near an upper section of the side recess 250 that cooperate with the indexing features 66 formed on the compartment wall 56 to further properly locate the reservoir 14 with respect to the base unit so that the umbrella valve 208 is properly actuated by the valve actuator 148. The compartment wall 56 and the side extension 52 can counteract horizontal forces that may develop from fluid moving in the reservoir 14 and can provide stability to the power washer 10 during transport. As mentioned above, if the filter assembly 150 is removed from the base unit 12, then the valve actuator 148 can not actuate the umbrella valve 208.

With reference back to FIG. 1, the hose 16 includes at one end a male quick-connect fitting 260 that connects to the movable fitting 132 on the base unit 12. At the other end, the hose 16 includes a female quick-connect fitting 262 that connects with the nozzle 18. Other types of fittings and connections can be provided. The nozzle 18 includes a trigger 264 that actuates a valve within the nozzle to control the dispensing of fluid from the power washer 10.

To use the power washer, one can remove the cap 232 to expose the filling opening 210 and fill the internal compartment 200 of the reservoir 14 with a fluid, typically by passing the fluid through the filter 236. The reservoir 14 is then installed on the base unit 12. The lower cap 204 is inserted into the socket 42 such that the valve actuator 148 operates the umbrella valve 208, which allows water to flow from the internal compartment 200 of the reservoir 14 into the base unit 12. More particularly, water flows through the filter 146, which operates as a secondary filter, and then into the inlet tubing 126. From the inlet tubing 126 water enters the inlet opening 122 of the pump 88 and is pressurized and dispensed through the outlet tubing 128 en route to the outlet fitting 132. The hose 16 connects with the outlet fitting 132 and the nozzle 18 controls whether fluid is being dispensed.

Figure 7:
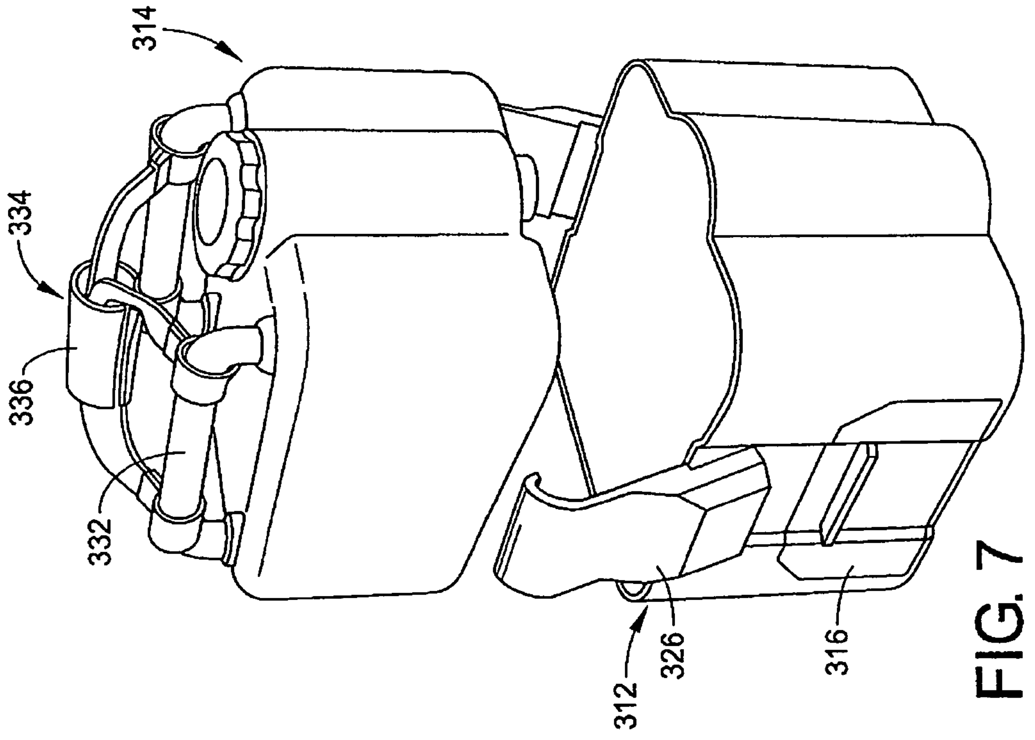
FIG. 7 is a perspective view of a water reservoir removed from a base unit of an alternative embodiment of a power washer.

FIG. 7 shows another embodiment of a pressure washer 310 that includes a base unit 312 and a removable water or other fluid reservoir 314. The basic components of this pressure washer 310 are very similar to the pressure washers described above, and therefore the differences between this embodiment of a pressure washer and those that have been described above will be highlighted. In this embodiment, the base unit 312 forms a socket into which the reservoir 314 is inserted. The base unit 312 can include a door 316 that provides access to a storage compartment. Accessories such as a spray nozzle (similar to nozzle 18 in FIG. 1) and a power cord can be stored in the storage compartment in the base unit 312.

Over-center latches 326 are provided on opposite sides of the base unit 312 to selectively connect the water reservoir 314 to the base unit 312. The over-center latches, instead of cooperating with a notch (similar to the embodiment described above) cooperate with a raised peripheral section at the top of the reservoir.

Two handle bars 332 attach to the top of the reservoir. A flexible handle assembly 334 attaches to the handle bars 332 and includes a hand grip 336 which can provide a handle for the entire power washer unit 310 or can be grasped by the user when the user desires to remove the water reservoir 314 from the base unit 312.

Figure 8:
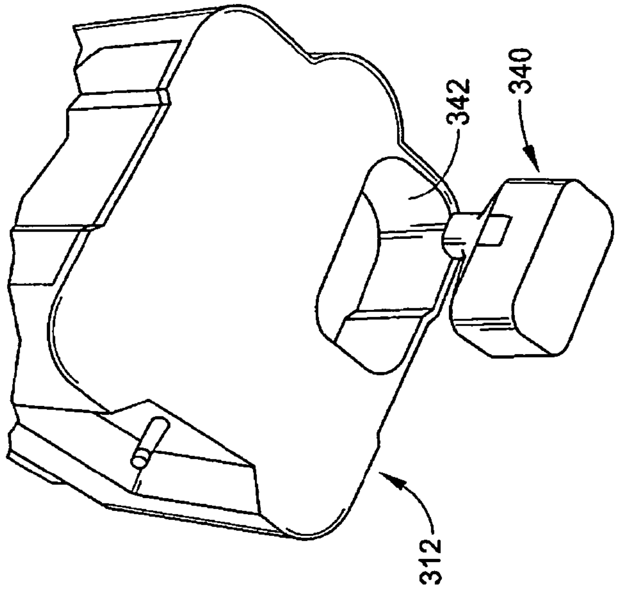
FIG. 8 is a perspective view of a lower side of the base unit for the power washer shown in FIG. 7.

With reference to FIG. 8, the base unit 312 is powered by a rechargeable battery 340 that provides electrical power to a pump (not shown, but similar to pump 88 described above). The battery 340 slides into a cavity 342 formed in the bottom of the base.

Figure 9:
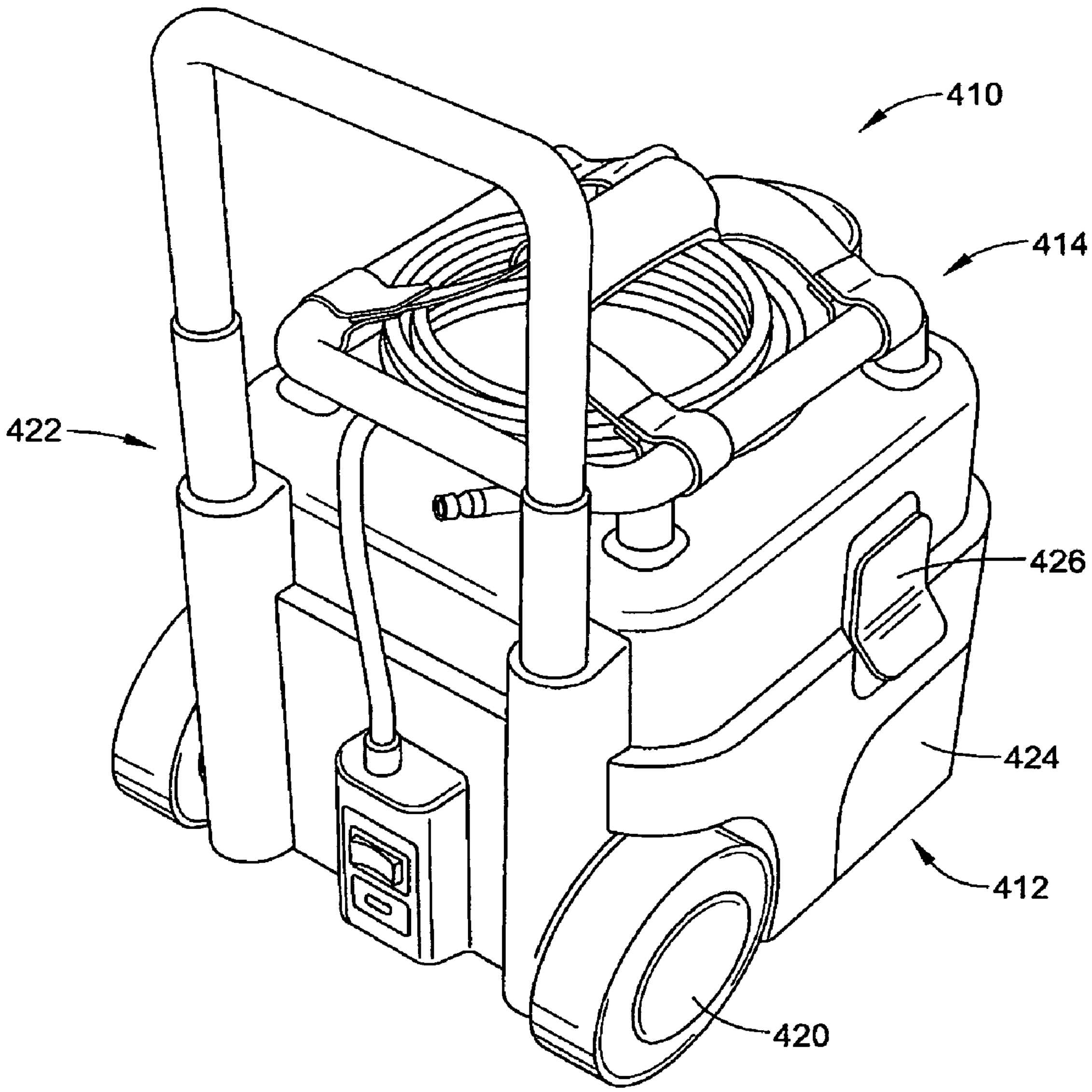
FIG. 9 is a perspective view of another embodiment of the power washer.

With reference to FIG. 9, a pressurized fluid dispenser or power washer 410 that is very similar in configuration to the power washers described above is shown. In this embodiment, a water reservoir 414 attaches to a base unit 412 using the smaller over-center latches 426 as compared to the embodiment disclosed in FIGS. 7 and 8. The base unit 412 includes the pump unit (not visible) and power source (not visible) similar to those described above. Accordingly, further description of the pump unit and power source is not provided. In this embodiment, the base unit also includes wheels 420 that allow the power washer 410 to be easily rolled across a surface. A telescoping handle assembly 422 is also provided so that one can pull the power washer 410 or push the power washer across a surface. Doors 424 (only one visible in FIG. 9) are provided in the base unit 412 to provide access to a battery (not visible) that provides electrical energy to the power washer 410 and to also provide a storage compartment for electrical cords, hoses, nozzles and the like.

Figure 10:
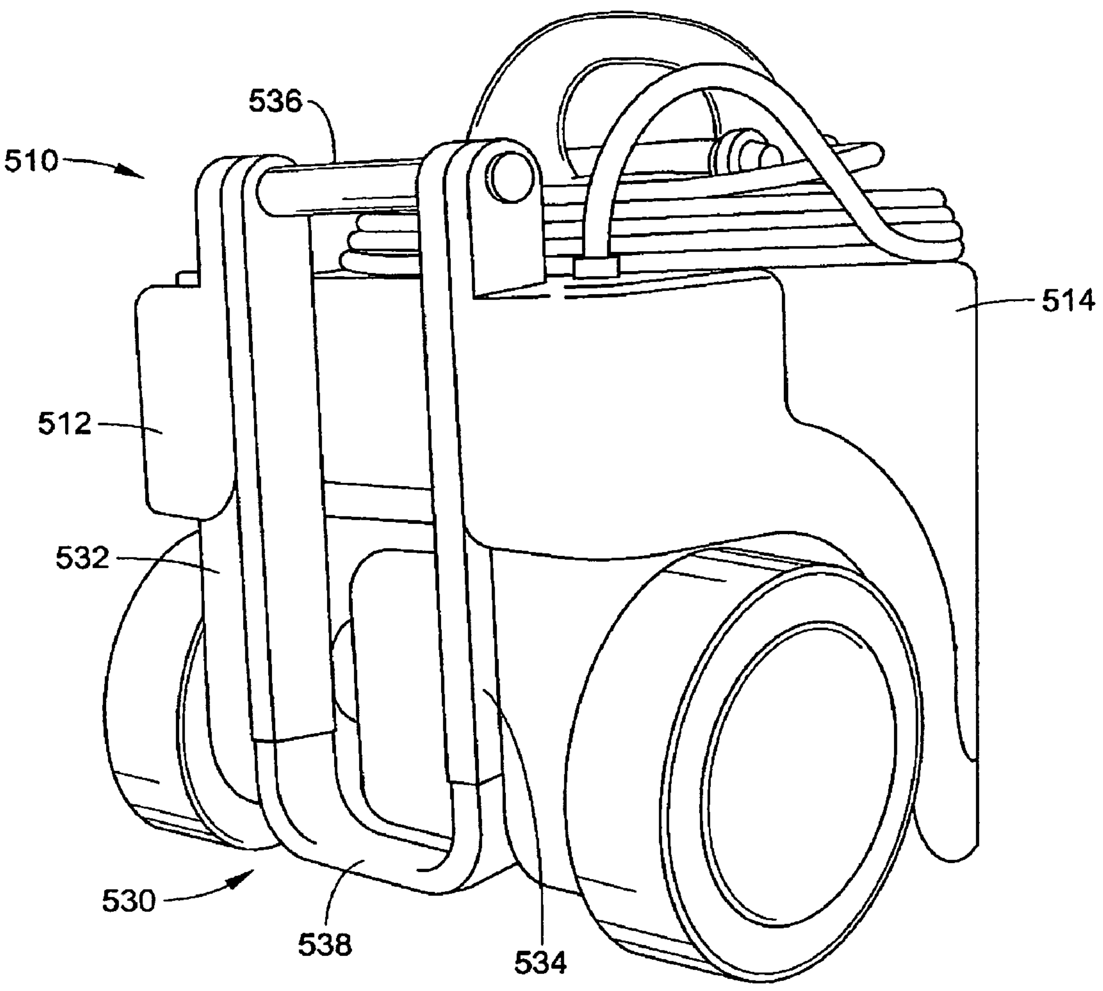
FIG. 10 is a perspective view of another embodiment of a power washer.
Figure 12:
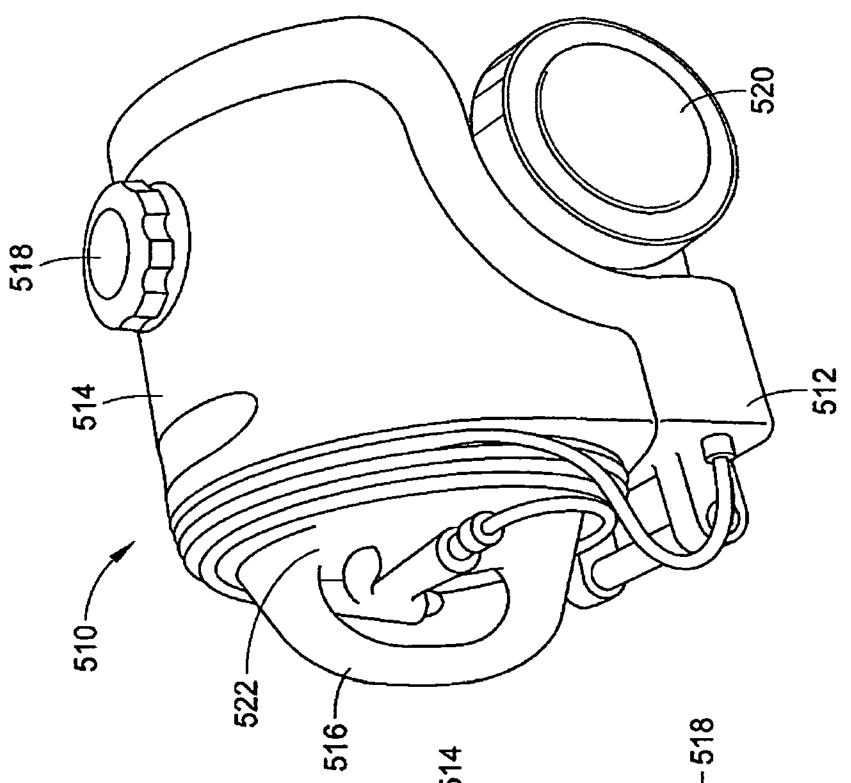
FIGS. 11 and 12 are perspective views of the embodiment shown in FIG. 10, showing two different orientations for the power washer.
Figure 11:
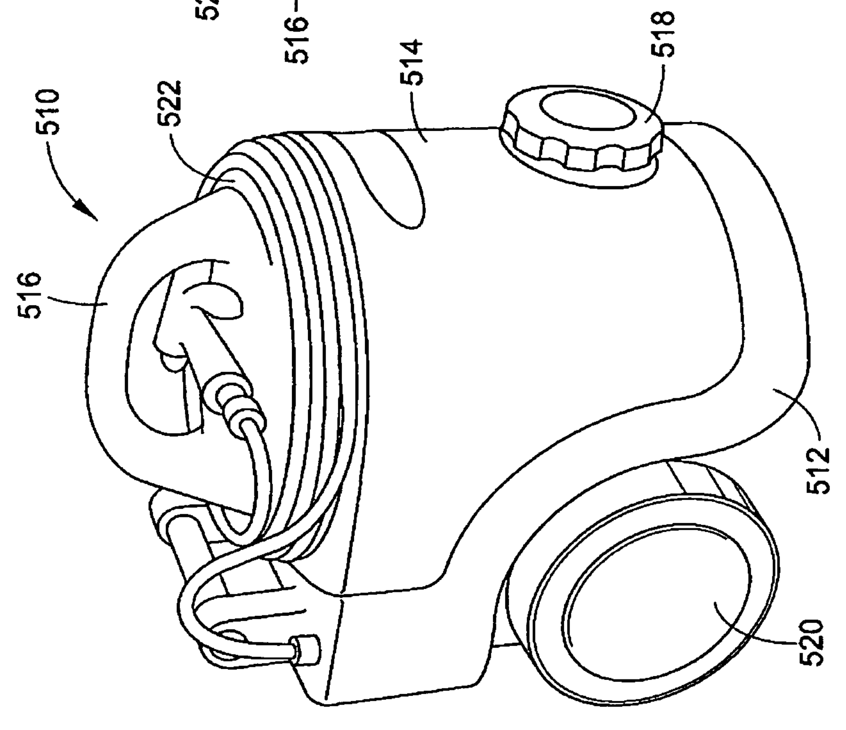

With reference to FIGS. 10-12, a further embodiment of a pressure washer 510 includes a base unit 512 and a reservoir 514. In this embodiment, the reservoir 514 can be permanently attached to, i.e. not intended to be removed from, the base unit 512. As seen when comparing FIG. 11 to FIG. 12, the power washer 510 can be oriented in two positions. In a first position, as shown in FIG. 11, a handle 516 of the water reservoir 514 is uppermost. In a second position, which is shown in FIG. 12, a screw cap 518 is uppermost. The pressure washer 510 can be oriented in the second position when it is being filled with water. One would remove the screw cap 518 to provide access to the internal compartment of the water reservoir. The pressure washer 510 would typically be situated in the first position when being maneuvered, e.g. pushed or pulled. The power washer 510 pivots about a wheel axis, which is defined by wheels 520, between the first position and the second position.

The water reservoir 514 can be formed to include hose saddle 522 in the form of a centrally located cylindrical projection that defines a circular surface about which the hose is reeled. As more clearly seen in FIG. 10, the power washer unit 510 can include a handle assembly 530. The handle assembly 530 includes first and second handle bars 532, 534 that attach to the base section 512 using a handle pivot bar 536. The handle bars 532 and 534 can pivot about the handle pivot bar 536. A U-shaped handle bar 538 is received in each lower handle bar 532 and 534 to provide the handle assembly 530 with a telescoping handle arrangement. In this embodiment, the handle assembly rotates up from a storage position and then handle bar 538 can be pulled out.

One example of a power washer has been described with particular detail. Some alterations to the design have also been described. Changes can be made to the design and the alterations described above without departing from the scope of the invention. For example, the reservoir can be modified to include convex sides, which can make the power washer more easily transportable. The configuration of the base unit can change, for example where the batteries are inserted into the lowermost surface of base unit or into other areas of the base unit. This can result in a reconfiguration of the base and the lowermost support surface of the reservoir. Also, detachable saddle bags can be provided with the power washer. Such saddle bags can drape over the larger sides of the reservoir and hold the nozzle, the hose, and an electrical cord for insertion into a cigarette lighter, for example. The flexible panel 72 in FIGS. 1-6 can be modified to become a removable panel for the storage of implements that are used with the power washer. The reservoir and/or the base unit can also be formed to provide a location for storing the hose that connects the nozzle to the hose unit. For example, an integrally formed hose saddle can be formed to provide a surface, e.g. an annular surface, about which the hose can be reeled. Moreover, the power washer can be provided with wheels that attach to the base unit and a handle, such as a telescoping handle, that attaches to the base unit to allow the power washer to be wheeled around.

Other modifications and alterations will occur to those upon reading and understanding the preceding detailed description. Many of these modifications have been described in the provisional patent application Ser. No. 61/000,189, which has been incorporated by reference. The invention is not limited to only those embodiments disclosed above. Instead, the invention is defined by the appended claims and the equivalents thereof.

The invention claimed is:

1. A pressurized fluid dispenser comprising:
- a base unit including
  - a pump,
  - a battery compartment comprising electrical contacts electrically connected with the pump,
  - a socket in fluid communication with the pump, and
  - a valve actuator; and
- a reservoir supported by and selectively removable from the base unit, the reservoir including
  - an internal compartment that is in fluid communication with the pump when the reservoir is connected to the base unit, and
  - a valve assembly in fluid communication with the internal compartment, the valve assembly inhibiting fluid flow out of the internal compartment when the reservoir is disconnected from the base unit;
- wherein the socket receives the valve assembly, and wherein the valve actuator automatically opens the valve assembly when the reservoir is connected to the base unit to allow fluid flow from the internal compartment to the pump.

2. The pressurized fluid dispenser of claim 1, wherein one of the reservoir and the base unit includes a catch and the other of the reservoir and the base unit includes a latch, wherein the catch cooperates with the latch to connect the reservoir to the base unit.

3. The pressurized fluid dispenser of claim 1, wherein the reservoir includes a lower outlet spout and a lowermost support surface, the lower outlet spout being disposed vertically above the lowermost support surface when the lowermost surface is resting on an associated horizontal surface.

4. The pressurized fluid dispenser of claim 3, wherein the lowermost support surface includes an inclined section configured to cooperate with the base unit to allow the reservoir to be situated so that fluid found in the internal compartment of the reservoir is directed toward the lower outlet spout.

5. The pressurized fluid dispenser of claim 1, wherein the base unit includes first and second battery receptacles, the electrical contacts being disposed in the first battery receptacle and the second battery receptacle being electrically isolated from the pump and configured to store an extra battery.

6. The pressurized fluid dispenser of claim 1, wherein the base unit includes a battery receptacle and an electrical cord receptacle each in electrical communication with the pump, the battery receptacle being spaced from the electrical cord receptacle such that the electrical cord receptacle is blocked when an associated battery is received in the battery receptacle to preclude insertion of an associated electrical cord into the electrical cord receptacle when the associated battery is received in the battery receptacle.

7. The pressurized fluid dispenser of claim 1, further comprising a fitting movably mounted on the base unit, wherein the pump is in fluid communication with the fitting and the fitting is configured to connect with an associated hose.

8. The pressurized fluid dispenser of claim 7, further comprising a pivot joint for movably mounting the fitting to the base unit such that the fitting that pivots between a substantially vertical orientation and a substantially horizontal orientation.

9. The pressurized fluid dispenser of claim 8, wherein the base unit includes a housing for the pump, wherein the housing includes a cavity formed in the housing and the fitting is received in the cavity in the housing, and when the fitting is oriented in the substantially vertical position the fitting is disposed in the cavity such that an outermost edge of the fitting is at least flush with or disposed inside of the cavity of the housing.

10. The pressurized fluid dispenser of claim 1, further comprising a cap and a filter assembly, wherein the reservoir includes a filling opening and the cap connects with the reservoir to cover the filling opening, wherein the filter assembly includes a filter and an annular shoulder connected with the filter and supported by the reservoir adjacent the opening for filtering fluid that enters the internal compartment through the filling opening, wherein the annular shoulder comprises a conformable material, which allows the annular shoulder to operate as a gasket to seal the filling opening when the cap is attached to the reservoir.

11. The pressurized fluid dispenser of claim 1, wherein the socket is configured to connect with a hose that can be placed in an associated fluid source for providing fluid to the pump when the reservoir is disconnected from the base unit.

12. The pressurized fluid dispenser of claim 1, further comprising a filter connected with the valve actuator, the filter being positioned such that fluid entering the base unit from the reservoir and traveling towards the pump flows through the filter.

13. The pressurized fluid dispenser of claim 12, wherein the filter and the valve actuator are removable from the base unit.

14. The pressurized fluid dispenser of claim 1, wherein the reservoir includes a handle located near an uppermost surface of the reservoir, wherein the handle extends along an axis that is generally parallel with a longest dimension of a lowermost surface of the reservoir.

15. The pressurized fluid dispenser of claim 1, wherein the base unit includes a housing and the reservoir is received by the housing such that a lowermost surface of the reservoir is surrounded by the housing of the base unit.

16. The pressurized fluid dispenser of claim 15, wherein the housing of the base unit includes a side extension that extends upwardly from a periphery of the housing and a compartment wall connected with the side extension, the compartment wall extends upwardly from the housing and extends from the side extension into the housing, and the reservoir includes a recess that receives the compartment wall.

17. The pressurized fluid dispenser of claim 16, further comprising a panel connected with the side extension, wherein the panel, the side extension and the compartment wall define a compartment for storing at least one of a hose, a nozzle and a battery charger.

18. A female panel mount for an electrically operated unit comprising:

an electrical cord receptacle configured to receive and electrically connect with an associated electrical cord; and a battery receptacle configured to receive and electrically connect with an associated battery, the battery receptacle being spaced from the electrical cord receptacle such that when a portion of the associated battery is inserted into the battery receptacle the electrical cord receptacle is covered by another portion of the associated battery to prevent access to the electrical cord receptacle.

19. The female panel mount of claim 18, further comprising a storage battery receptacle spaced from the electrical cord receptacle and the battery receptacle, the storage battery receptacle configured to receive and to store at least one associated stored battery.

20. The female panel mount of claim 19, wherein the storage battery receptacle is configured to receive the at least one stored battery while the portion of another associated battery is received in the battery receptacle.

21. The female panel mount of claim 18 in combination with a pressurized fluid dispenser, wherein the pressurized fluid dispenser includes an electric pump and the electrical cord receptacle and the battery receptacle are each electrically connected with the electric pump.

22. A pressurized fluid dispenser comprising:

a housing;

a pump supported by the housing;

a reservoir connected with the housing and including an internal compartment that is in fluid communication with the pump;

a first electrical receptacle supported by the housing and electrically connected with the pump, the first electrical receptacle being configured to cooperate with an associated battery to provide power to the pump; and a second electrical receptacle supported by the housing and electrically connected with the pump, the second electrical receptacle being spaced from the first electrical receptacle and configured to cooperate with an associated electrical cord to provide power to the pump.

23. The pressurized fluid dispenser of claim 22, wherein the first electrical receptacle is positioned with respect to the second electrical receptacle such that when the associated battery is received in the first electrical receptacle the associated battery covers the second electrical receptacle.

24. The pressurized fluid dispenser of claim 22, wherein the reservoir is selectively detachable from the housing and the pump.

25. The pressurized fluid dispenser of claim 22, further comprising one or more of a) a battery storage receptacle in the housing, wherein the battery storage receptacle is positioned and configured with respect to the first electrical receptacle such that one associated battery can be received in the battery storage receptacle while another associated battery is received in the first electrical receptacle and providing electrical power to the pump; b) a side wall that extends upwardly from at least one side of the housing and the reservoir includes a recess that fits with the side wall; c) a side wall that extends upwardly from at least one side of the housing and the reservoir includes a recess that fits with the side wall and defines a compartment configured to store at least one of a hose, a nozzle and a battery.

* * * * *